United States Patent
Sandhu

(10) Patent No.: US 7,364,981 B2
(45) Date of Patent: Apr. 29, 2008

(54) METHODS OF FORMING TRENCH ISOLATION IN THE FABRICATION OF INTEGRATED CIRCUITRY, METHODS OF FABRICATING MEMORY CIRCUITRY, INTEGRATED CIRCUITRY AND MEMORY INTEGRATED CIRCUITRY

(75) Inventor: Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/527,359

(22) Filed: Sep. 25, 2006

(65) Prior Publication Data
US 2007/0020881 A1 Jan. 25, 2007

Related U.S. Application Data

(62) Division of application No. 10/931,524, filed on Aug. 31, 2004, now Pat. No. 7,235,459.

(51) Int. Cl.
*H01L 21/76* (2006.01)
(52) U.S. Cl. .................. 438/427; 438/435; 438/437; 257/E21.548
(58) Field of Classification Search ........... 438/427, 438/435, 437; 257/E21.548
See application file for complete search history.

(56) References Cited

U.S. PATENT DOCUMENTS 3,809,574 A 5/1974 Duffy et al.
3,990,927 A 11/1976 Montier
4,474,975 A 10/1984 Clemons et al.
5,105,253 A 4/1992 Pollock
5,156,881 A 10/1992 Okano et al.
5,182,221 A 1/1993 Sato
5,387,539 A 2/1995 Yang et al.
5,410,176 A 4/1995 Liou et al.
5,470,798 A 11/1995 Ouellet
5,516,721 A 5/1996 Galli et al.
5,518,959 A 5/1996 Jang et al.
5,565,376 A 10/1996 Lur et al.
5,604,149 A 2/1997 Paoli et al.
5,616,513 A 4/1997 Shepard
5,702,977 A 12/1997 Jang et al.
5,719,085 A 2/1998 Moon et al.
5,741,740 A 4/1998 Jang et al.

(Continued)

FOREIGN PATENT DOCUMENTS

EP 0817251 A 1/1998

(Continued)

OTHER PUBLICATIONS

Curtis et al, "APCVD TEOS: O3 Advanced Trench Isolation Applications", Semiconductor Fabtech, 9th Ed., p. 241-247.

(Continued)

*Primary Examiner*—Trung Dang
(74) *Attorney, Agent, or Firm*—Wells St. John P.S.

(57) ABSTRACT

The invention includes methods of forming trench isolation in the fabrication of integrated circuitry, methods of fabricating integrated circuitry including memory circuitry, and integrated circuitry such as memory integrated circuitry.

20 Claims, 7 Drawing Sheets

U.S. PATENT DOCUMENTS

| | | | |
|---|---|---|---|
| 5,770,469 A | 6/1998 | Uram et al. | |
| 5,776,557 A | 7/1998 | Okano et al. | |
| 5,786,039 A | 7/1998 | Brouquet | |
| 5,786,263 A | 7/1998 | Perera | |
| 5,801,083 A | 9/1998 | Yu et al. | |
| 5,863,827 A | 1/1999 | Joyner | |
| 5,883,006 A | 3/1999 | Iba | |
| 5,888,880 A | 3/1999 | Gardner et al. | |
| 5,895,253 A | 4/1999 | Akram | |
| 5,895,255 A | 4/1999 | Tsuchiaki | |
| 5,904,540 A | 5/1999 | Sheng et al. | |
| 5,923,073 A | 7/1999 | Aoki et al. | |
| 5,930,645 A | 7/1999 | Lyons et al. | |
| 5,930,646 A | 7/1999 | Gerung et al. | |
| 5,943,585 A | 8/1999 | May et al. | |
| 5,950,094 A | 9/1999 | Lin et al. | |
| 5,960,299 A | 9/1999 | Yew et al. | |
| 5,972,773 A | 10/1999 | Liu et al. | |
| 5,976,949 A | 11/1999 | Chen | |
| 5,981,354 A | 11/1999 | Spikes et al. | |
| 5,989,978 A | 11/1999 | Peidous | |
| 5,998,280 A | 12/1999 | Bergemont et al. | |
| 6,013,583 A | 1/2000 | Ajmera et al. | |
| 6,030,881 A | 2/2000 | Papasouliotis et al. | |
| 6,033,961 A | 3/2000 | Xu et al. | |
| 6,051,477 A | 4/2000 | Nam | |
| 6,069,055 A | 5/2000 | Ukeda et al. | |
| 6,090,675 A | 7/2000 | Lee et al. | |
| 6,127,737 A | 10/2000 | Kuroi et al. | |
| 6,156,674 A | 12/2000 | Li et al. | |
| 6,171,962 B1 | 1/2001 | Karlsson et al. | |
| 6,187,651 B1 | 2/2001 | Oh | |
| 6,190,979 B1 | 2/2001 | Radens et al. | |
| 6,191,002 B1 | 2/2001 | Koyanagi | |
| 6,245,641 B1* | 6/2001 | Shiozawa et al. | 438/427 |
| 6,265,282 B1 | 7/2001 | Lane et al. | |
| 6,300,219 B1 | 10/2001 | Doan et al. | |
| 6,326,282 B1 | 12/2001 | Park et al. | |
| 6,329,266 B1 | 12/2001 | Hwang et al. | |
| 6,331,380 B1 | 12/2001 | Ye et al. | |
| 6,355,966 B1 | 3/2002 | Trivedi | |
| 6,448,150 B1 | 9/2002 | Tsai et al. | |
| 6,455,394 B1 | 9/2002 | Iyer et al. | |
| 6,534,395 B2 | 3/2003 | Werkhoven et al. | |
| 6,583,028 B2 | 6/2003 | Doan et al. | |
| 6,583,060 B2 | 6/2003 | Trivedi | |
| 6,607,959 B2* | 8/2003 | Lee et al. | 438/424 |
| 6,617,251 B1 | 9/2003 | Kamath et al. | |
| 6,719,012 B2 | 4/2004 | Doan et al. | |
| 6,821,865 B2 | 11/2004 | Wise et al. | |
| 6,930,058 B2 | 8/2005 | Hill et al. | |
| 6,933,225 B2 | 8/2005 | Werkhoven et al. | |
| 7,033,909 B2 | 4/2006 | Kim et al. | |
| 7,053,010 B2 | 5/2006 | Li et al. | |
| 2001/0006255 A1 | 7/2001 | Kwon et al. | |
| 2001/0006839 A1 | 7/2001 | Yeo | |
| 2001/0041250 A1 | 11/2001 | Haukka et al. | |
| 2001/0046753 A1 | 11/2001 | Gonzalez et al. | |
| 2002/0000195 A1 | 1/2002 | Kao et al. | |
| 2002/0004284 A1 | 1/2002 | Chen | |
| 2002/0018849 A1 | 2/2002 | George et al. | |
| 2003/0032281 A1 | 2/2003 | Werkhoven et al. | |
| 2003/0129826 A1 | 7/2003 | Werkhoven et al. | |
| 2004/0016987 A1 | 1/2004 | Sawada et al. | |
| 2004/0032006 A1 | 2/2004 | Yun et al. | |
| 2004/0082181 A1 | 4/2004 | Doan et al. | |
| 2004/0209484 A1 | 10/2004 | Hill et al. | |
| 2004/0266153 A1 | 12/2004 | Hu | |
| 2005/0009293 A1* | 1/2005 | Kim et al. | 438/424 |
| 2005/0009368 A1 | 1/2005 | Vaarstra | |
| 2005/0054213 A1 | 3/2005 | Derderian et al. | |
| 2005/0079730 A1 | 4/2005 | Beintner et al. | |
| 2005/0112282 A1 | 5/2005 | Gordon et al. | |
| 2005/0124171 A1 | 6/2005 | Vaarstra | |
| 2005/0142799 A1 | 6/2005 | Seo | |

FOREIGN PATENT DOCUMENTS

| | | |
|---|---|---|
| EP | 959493 | 11/1999 |
| JP | 02277253 A | 11/1990 |
| JP | 05-315441 | 11/1993 |
| JP | 06-334031 | 12/1994 |
| JP | 0146224 | 1/1996 |
| WO | 02/27063 A2 | 4/2002 |
| WO | US2004/021156 | 6/2004 |

OTHER PUBLICATIONS

George, S.M. et al., "Atomic layer controlled deposition of $SiO_2$ and $Al_2O_3$ using ABAB . . . binary reaction sequence chemistry", Applied Surface Science 82/83, Elsevier Science B.V., Jul. 10, 1994, p. 460-467.

Morishita et al. "Atomic-layer chemical-vapor-deposition of silicon-nitride", Applied Surface Science 112, Elsevier Science B.V., 1997, p. 198-204.

Beekmann et al., *Sub-micron Gap Fill and In-Situ Planarisation using Flowfill™ Technology*, Electrotech 1-7 ULSI Conference, Portland, OR (Oct. 1995).

Horie et al., *Kinetics and Mechanism of the Reactions of $O(^3P)$ with $SiH_4$, $CH_3SiH_3$, $(CH_3)_2SIH_2$, and $(CH_3)_3SiH$*, 95 J. Phys. Chem 4393-4400 (1991).

Yokoyama et al. "Atomic layer controlled deposition of silicon nitride and in situ growth observation by infrared reflection absorption spectroscopy", Applied Surface Science 112, Elsevier Science B.V., 1997, p. 75-81.

Gasser et al., "Quasi-monolayer deposition of silicon dioxide", Elsevier Science S.A., 1994, p. 213-218.

Shareef et al., "Subatmospheric chemical vapor deposition ozone/TEOS process for $SiO_2$ trench filling", J. Vac. Sci. Technol. B 13(4), Jul./Aug. 1995, p. 1888-1892.

Kojima et al., *Planarization Process Using a Multi-Coating of Spin-on-Glass*, V-MIC Conference, pp. 390-396 (Jun. 13-14, 1988).

Joshi et al., *Plasma Deposited Organosilicon Hydride Network Polymers as Versatile Resists for Entirely Dry Mid-Deep UV Photolithography*, 1925 SPIE 709-720 (Jan. 1993).

Kiermasz et al., *Planarisation for Sub-Micron Devices Utilising a New Chemistry*, Electrotech 1-2, DUMIC Conference, California (Feb. 1995).

U.S. Appl. No. 10/806,923, filed Mar. 2004, Li et al.

U.S. Appl. No. 10/931,524, filed Aug. 2004, Sandhu.

McClatchie et al. *Low Dielectric Constant Flowfill™ Technology for IMD Applications*, 7 pages (pre-Aug. 1999).

Matsuura et al., *Novel Self-planarizing CVD Oxide for Interlayer Dielectric Applications*; 1994; 94 IEEE 117-120.

Disclosed Anonymous 32246, "Substrate Contact with Closed Bottom Trenches", Research Disclosure, Feb. 1991, 1 page.

Matsuura et al., *A Highly Reliable Self-planarizing Low-k Intermetal Dielectric for Sub-quarter Micron Interconnects*, 97 IEEE 785-788 (Jul. 1997).

Chen et al., *Excimer Laser-Induced Ti Silicidation to Eliminate the Fine-Line Effect for Integrated Circuity Device Fabrication*, 149 Journal of Electrochemical Society, No. 11, pp. G609-G612 (2002).

Nishiyama et al., *Agglomeration Resistant Self-Aligned Silicide Process Using $N_2$ Implantation into $TiSi_2$*, 36 JPN. J.Appl. Phys., Part 1, No. 6A, pp. 3639-3643 (Jun. 1997).

Wolf, *Chapter 13: Polycides and Salicides of TiSix, CoSi2, and NiSi*, Silicon Processing for the VLSI Era, vol. IV, pp. 603-604 (pre-2003).

Klaus et al., *Atomic Layer Deposition of $SiO_2$ Using Catalyzed and Uncatalyzed Self-Limiting Surface Reactions*, 6 Surface Review and Letters, Nos. 3 and 4, pp. 435-448 (1999).

Withnall et al., *Matrix Reactions of Methylsilanes and Oxygen Atoms*, 92 J. Phys. Chem. 594-602 (1988).

Hausmann et al., "Catalytic vapor deposition of highly conformal silica nanolaminates", Department of Chemistry and Chemical Biology, Harvard University, May 14, 2002, pp. 1-13.

Hausmann et al., *Rapid Vapor Deposition of Highly Conformal Silica Nanolaminates*, 298 SCIENCE 402-406 (Oct. 11, 2002).

Miller et al., *Self-limiting chemical vapor deposition of an ultra-thin silicon oxide film using tri-(tert-butoxy) Silanol*, 397 Thin Solid Films 78-82 (2001).

\* cited by examiner

METHODS OF FORMING TRENCH ISOLATION IN THE FABRICATION OF INTEGRATED CIRCUITRY, METHODS OF FABRICATING MEMORY CIRCUITRY, INTEGRATED CIRCUITRY AND MEMORY INTEGRATED CIRCUITRY

This patent resulted from a divisional application of U.S. patent application Ser. No. 10/931,524, filed Aug. 31, 2004, now U.S. Pat. No. 7,235,459, entitled "Methods of Forming Trench Isolation in the Fabrication of Integrated Circuitry, Methods of Fabricating Memory Circuitry, Integrated Circuitry and Memory Integrated Circuitry", naming Gurtej S. Sandhu as inventor, the disclosure of which is incorporated by reference.

TECHNICAL FIELD

This invention relates to methods of forming trench isolation in the fabrication of integrated circuitry, to methods of fabricating integrated circuitry including memory circuitry, and to integrated circuitry including memory integrated circuitry.

BACKGROUND OF THE INVENTION

In the fabrication of integrated circuitry, numerous devices are packed onto a single small area of a semiconductor substrate to create an integrated circuit. Many of the individual devices are electrically isolated from one another. Accordingly, electrical isolation is an integral part of semiconductor device design for preventing unwanted electrical coupling between adjacent components and devices.

As the size of integrated circuits is reduced, the devices that make up the circuits are positioned closer together. Conventional methods of isolating circuit components use trench isolation. Such is typically formed by etching trenches into a semiconductor substrate and filling the trenches with insulative material. As the density of components on the semiconductor substrate increased, the widths of the trenches have decreased. Further, it is not uncommon to find different areas of a substrate as having different width and/or different depth isolation trenches. Also and regardless, some areas of integrated circuitry have greater minimum active area spacing between isolation trenches than do other areas.

Insulative materials that are commonly utilized for electrical isolation within isolation trenches include silicon dioxide and silicon nitride. For example, it is common to thermally oxidize trench sidewalls within a silicon-comprising semiconductor substrate, and provide a thin silicon nitride layer thereover. The remaining volume of the trenches is then filled with an insulative material, for example high density plasma deposited silicon dioxide. Yet as trenches have become deeper and narrower, high density plasma deposited oxides can result in undesired void formation within the trenches during filling. Alternate techniques which provide better conformal deposition within isolation trenches include spin-on-glass and chemical vapor deposition utilizing ozone and tetraethylorthosilicate (TEOS). Such latter processes, while resulting in good void-free gap filling, typically result in a silicon dioxide deposition which is not as dense as desired. Accordingly, a steam anneal at very high temperatures is typically utilized to densify the deposited silicon dioxide. To preclude undesired oxide formation of underlying material, a silicon nitride oxidation barrier layer is typically employed within all of the trenches to shield underlying material from being oxidized during the steam anneal. Yet in some instances, it is undesirable to have a silicon nitride layer received next to the edges of active devices. This is particularly so in tight isolation spaced regions due to either silicon nitride's high dielectric constant or its ability to charge up by storing injected electrons which may compromise the performance of the devices.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention includes methods of forming trench isolation in the fabrication of integrated circuitry, methods of fabricating memory circuitry, and memory integrated circuitry. In one implementation, first and second isolation trenches are formed into semiconductive material of a semiconductor substrate. The first isolation trench has a narrowest cross sectional dimension which is less than that of the second isolation trench. A first insulative material is deposited to within the first and second isolation trenches effective to fill remaining volume of the first isolation trench within the semiconductive material but not that of the second isolation trench within the semiconductive material. An intermediate insulative material lining is deposited over the first insulative material within the second isolation trench within the semiconductive material, but not within the first isolation trench within the semiconductive material. The intermediate insulative material lining comprises opposing sidewalls that face one another within the semiconductive material and a base surface extending from and between the opposing and facing sidewalls within the semiconductive material. After the depositing of the intermediate insulative material lining, a second insulative material is deposited over the opposing and facing sidewalls, and over the base surface, effective to fill remaining volume of the second isolation trench within the semiconductive material. The intermediate insulative material lining is different from that of the first and second insulative materials.

In one implementation, a method of forming integrated circuitry, comprising forming isolation trenches within semiconductive material of a first area of circuitry of a semiconductor substrate and within semiconductive material of a second area of circuitry of the semiconductor substrate. The first circuitry area comprises a first minimum active area spacing between the isolation trenches received therein and the second circuitry area comprising a second minimum active area spacing between the isolation trenches received therein. The first minimum active area spacing is less than the second minimum active area spacing. A first insulative material is deposited to within the isolation trenches of the first circuitry area and to within the isolation trenches of the second circuitry area. The first insulative material less than fills remaining volume of the isolation trenches within the semiconductive material of the second circuitry area. After depositing the first insulative material, an insulative nitride-comprising layer is deposited to within the isolation trenches within the semiconductive material of the second circuitry area but not to within the isolation trenches within the semiconductive material of the first circuitry area. The insulative nitride-comprising layer comprises opposing sidewalls that face one another within the semiconductive material and a base surface extending from and between the opposing and facing sidewalls within the semiconductive material.

In one implementation, a method of fabricating memory circuitry, comprises forming isolation trenches within semiconductive material of a memory array area of a semiconductor substrate and within semiconductive material of a peripheral circuitry area of the semiconductor substrate. A first insulative material is deposited to within the isolation trenches of the memory array area and to within the isolation trenches of the peripheral circuitry area. The first insulative material less than fills remaining volume of the isolation trenches within the semiconductive material of the peripheral circuitry area. After depositing the first insulative material, an insulative nitride-comprising layer is deposited to within the isolation trenches within the semiconductive material of the peripheral circuitry area but not to within the isolation trenches within the semiconductive material of the memory array area. The insulative nitride-comprising layer comprises opposing sidewalls that face one another within the semiconductive material and a base surface extending from and between the opposing and facing sidewalls within the semiconductive material.

In one implementation, integrated circuitry comprises a semiconductor substrate comprising a first circuitry area and a second circuitry area. The first circuitry area comprises a first minimum active area spacing between the isolation trenches received therein and the second circuitry area comprising a second minimum active area spacing between the isolation trenches received therein. The first minimum active area spacing is less than the second minimum active area spacing. Isolation trenches are received within semiconductive material of the semiconductor substrate within the first circuitry area and within the second circuitry area. Insulative material is received within the isolation trenches within the semiconductive material within the first circuitry array area and within the second circuitry area. In one aspect, all insulative material within the first circuitry array area isolation trenches is void of any insulative aluminum oxide, with insulative material received within the isolation trenches within the second circuitry area comprising an insulative aluminum oxide-comprising layer. In one aspect, all insulative material within the first circuitry array area isolation trenches is void of any insulative nitride, with insulative material received within the isolation trenches within the second circuitry area comprising an insulative nitride-comprising layer. The insulative nitride-comprising layer comprises opposing sidewalls that face one another within the semiconductive material and a base surface extending from and between the opposing and facing sidewalls within the semiconductive material.

Other implementations and aspects are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
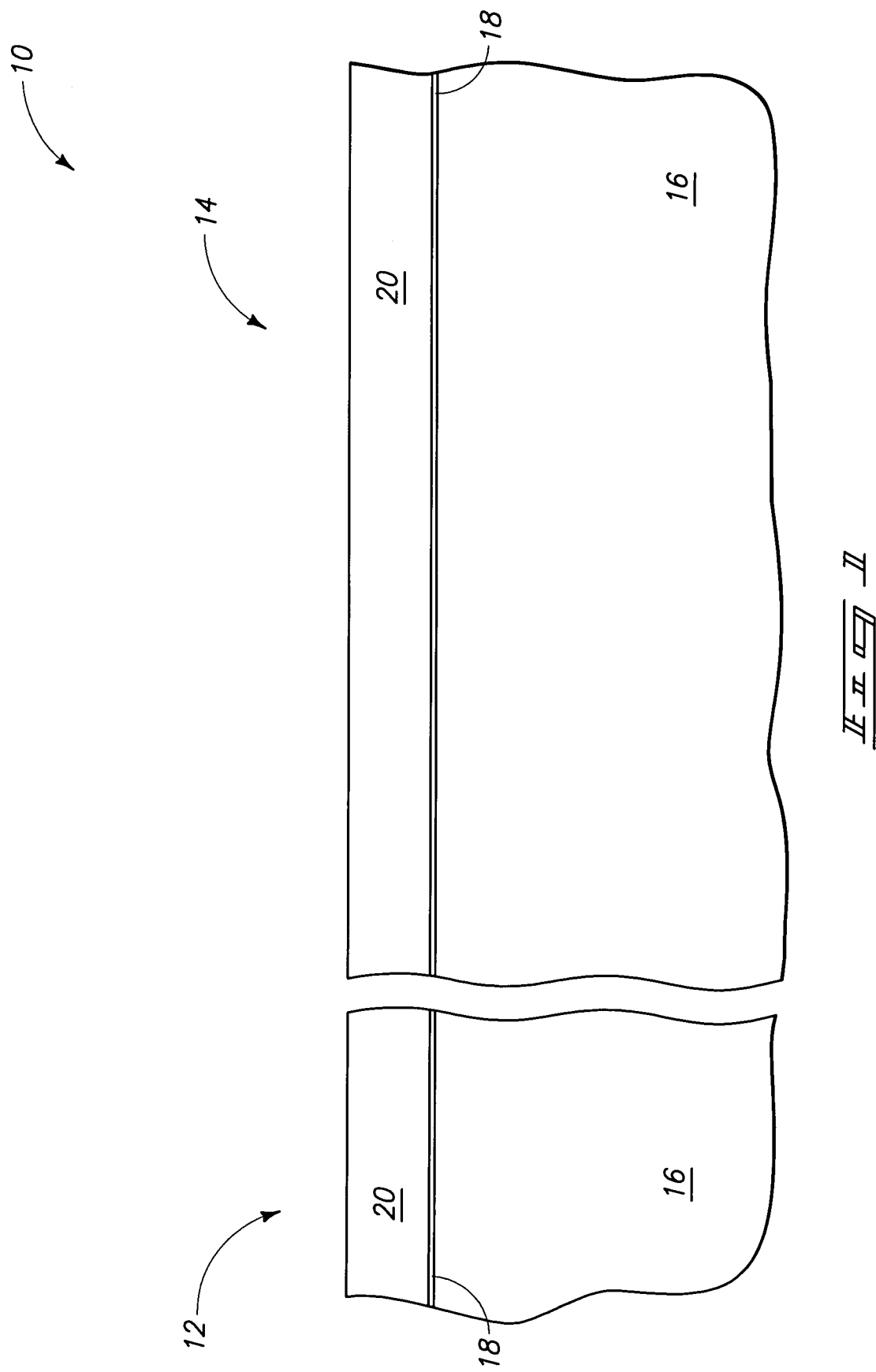
FIG. 1 is a fragmentary diagrammatic sectional view of a substrate in process in accordance with an aspect of the invention.

The invention contemplates methods of forming trench isolation in the fabrication of integrated circuitry and, in one exemplary preferred embodiment, in the fabricating of memory circuitry. Referring initially to FIG. 1, a semiconductor substrate is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. In one exemplary embodiment, FIG. 1 can be considered as depicting a first circuitry area 12 of semiconductor substrate 10 and a second circuitry area 14 of semiconductor substrate 10. In one exemplary implementation, the integrated circuitry being fabricated comprises memory circuitry with first circuitry area 12 comprising a memory array area and second circuitry area 14 comprising a peripheral circuitry area. In one exemplary implementation, the integrated circuitry comprises logic circuitry, with first circuitry area 12 comprising a logic circuitry area and second circuitry area 14 comprising metal routing area.

Semiconductor substrate 10 is depicted as comprising bulk semiconductive material 16, for example lightly doped monocrystalline silicon. Of course, semiconductor-on-insulator constructions and other substrates, whether existing or yet-to-be developed, are also contemplated. A pad oxide layer 18 has been formed over semiconductive material 16, and a silicon nitride masking layer 20 formed over pad oxide layer 18.

Figure 2:
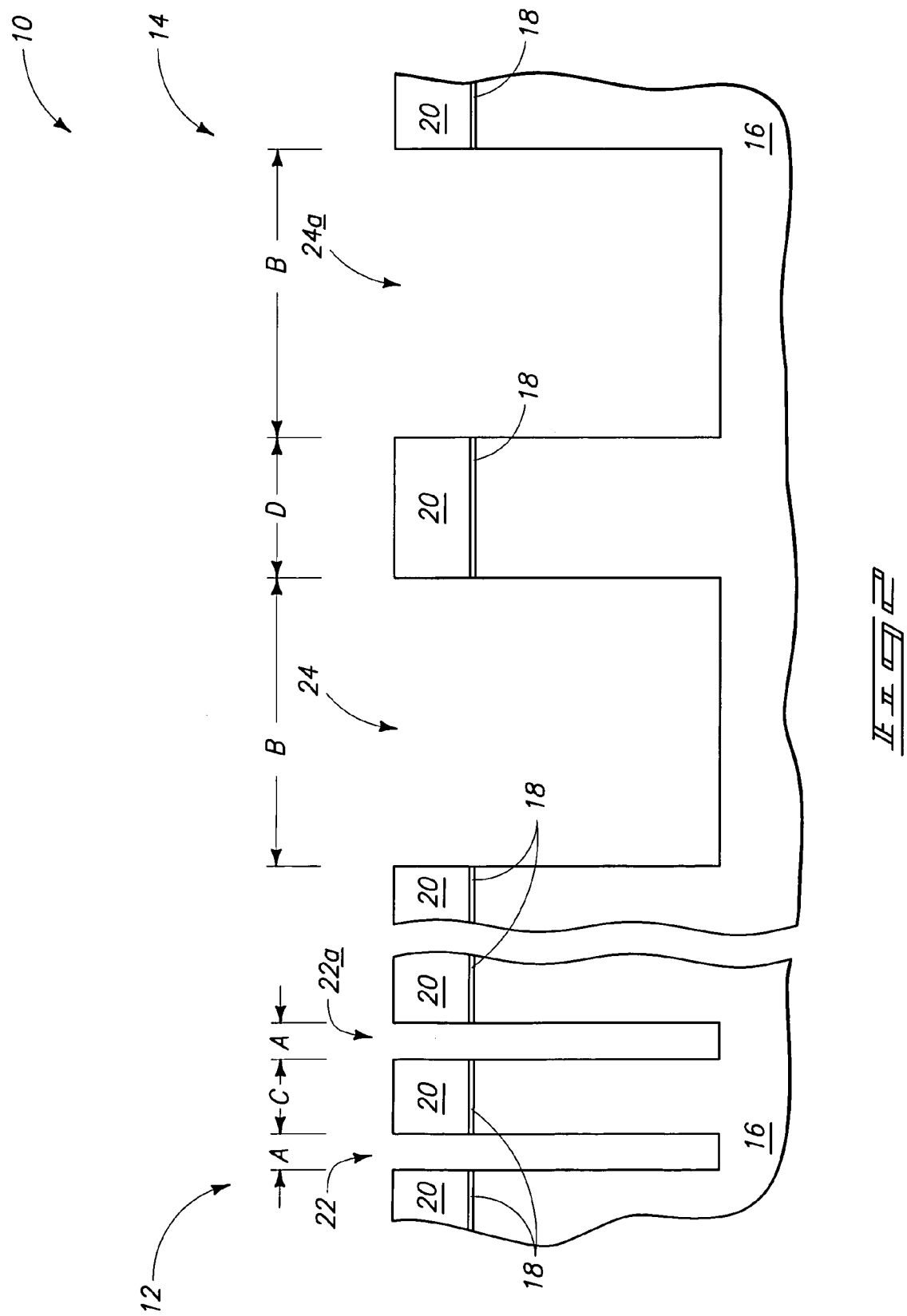
FIG. 2 is a view of the FIG. 1 substrate at a processing subsequent to that shown by FIG. 1.

Referring to FIG. 2, first isolation trenches 22, 22a and second isolation trenches 24, 24a, have been formed into semiconductive material 16 of semiconductor substrate 10. By way of example only, an exemplary technique for doing so comprises photolithographic patterning and etch. Trenches 22 and 22a might be of the same size and configuration or of different size and configuration relative to one another. Likewise, trenches 24 and 24a might be of the same size and configuration or of different size and configuration relative to one another. In one exemplary embodiment, isolation trenches 22, 22a as formed within semiconductive material 16 are formed within first circuitry area 12, while isolation trenches 24, 24a are formed within semiconductive material 16 received within second circuitry area 14. More than the illustrated pairs of such trenches would typically be fabricated in each of the respective areas, with only two of such trenches in each area being shown for clarity. Also, aspects of the invention contemplate fabrication with respect to only two different dimensioned trenches.

In the depicted exemplary embodiment, at least one of first isolation trenches 22, 22a has a narrowest cross sectional dimension "A" which is less than that of at least one of second isolation trenches 24, 24a and which is depicted by dimension "B". By way of example only, an exemplary narrowest dimension A for isolation trenches 22, 22a is 500 Angstroms, while that for narrowest dimension B of second isolation trenches 24, 24a is 1000 Angstroms. Further and regardless, in one exemplary aspect of the invention, first circuitry area 12 comprises a first minimum active area spacing C between isolation trenches 22, 22a received therein and the second circuitry area comprises a second minimum active area spacing D between isolation trenches 24, 24a received therein. The first minimum active area spacing is less than the second minimum active area spacing. By way of example only, an exemplary first minimum active area spacing C is from 10 to 110 nanometers, while that for second minimum active area spacing D is from 200 to 800 nanometers.

Figure 3:
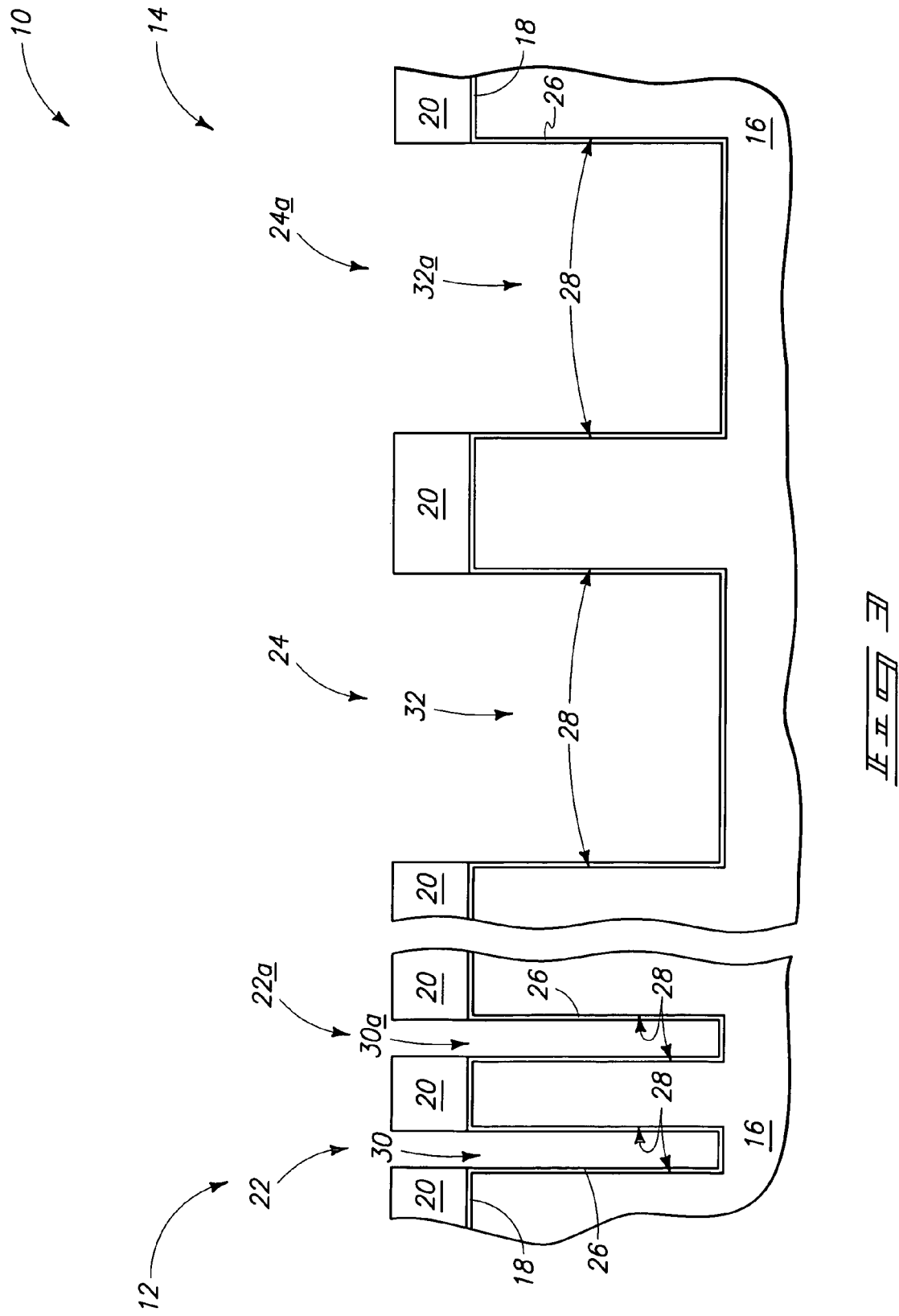
FIG. 3 is a view of the FIG. 2 substrate at a processing subsequent to that shown by FIG. 2.

Referring to FIG. 3, substrate 10 has been thermally oxidized to form silicon dioxide-comprising layers 26 which line each of trenches 22, 22a and 24, 24a. An exemplary thickness range for silicon dioxide layer 26 is from 50 Angstroms to 75 Angstroms. By way of example only, an exemplary technique or forming such layer includes furnace oxidation at 800° C., for example using $O_2$ and/or $N_2$ exposure, followed by $H_2O$ exposure, followed again by $O_2$ and/or $N_2$ exposure. Such layer might be formed later in the process, or not at all. Regardless, isolation trenches 22, 22a and 24, 24a can be considered as having semiconductive material sidewalls 28 and some remaining volume 30, 30a and 32, 32a respectively, within semiconductive material 16.

Figure 4:
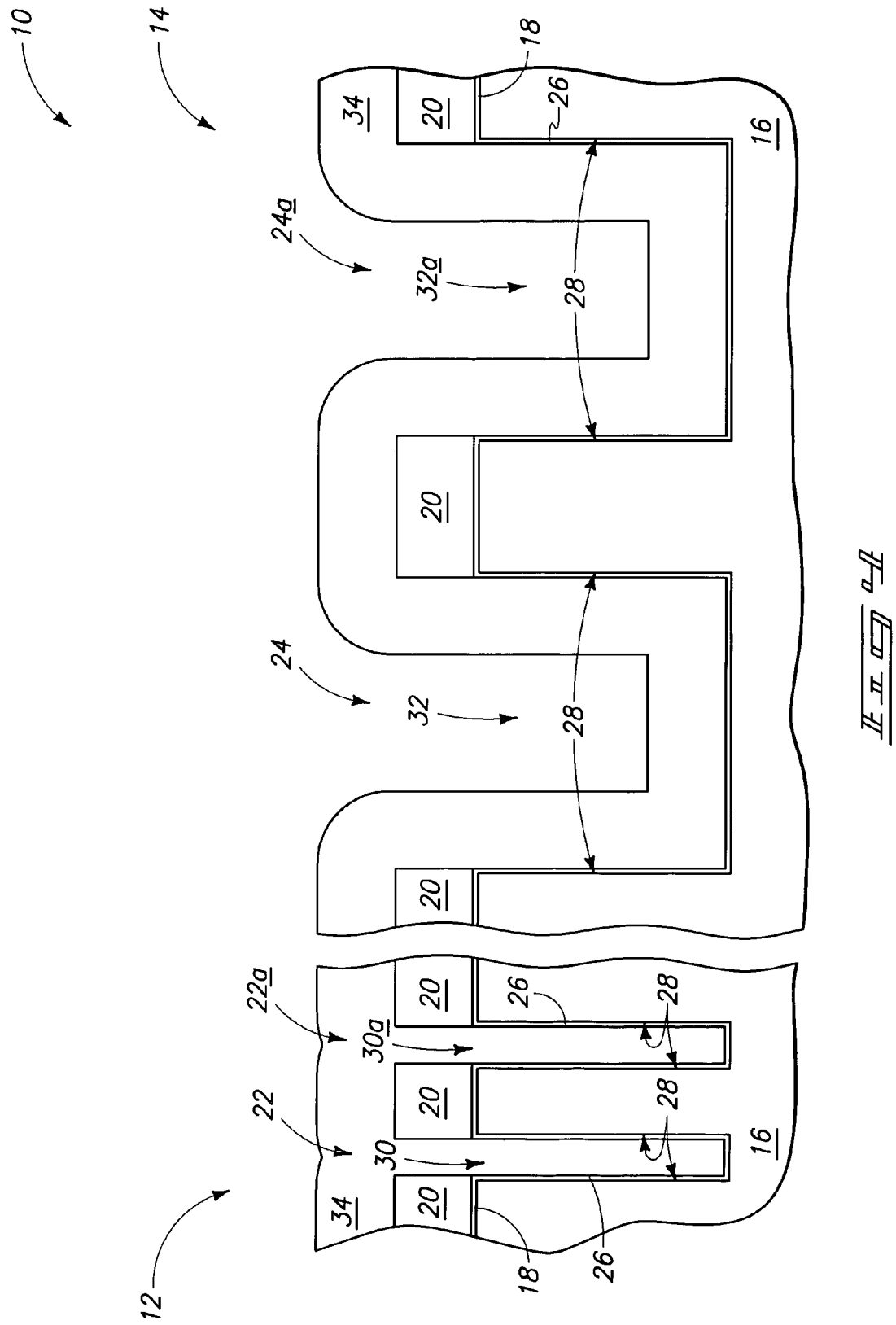
FIG. 4 is a view of the FIG. 3 substrate at a processing subsequent to that shown by FIG. 3.

Referring to FIG. 4, a first insulative material 34 is deposited to within first isolation trenches 22, 22a and second isolation trenches 24, 24a. In the depicted preferred embodiment, such first insulative material depositing is effective to fill remaining volumes 30, 30a of first isolation trenches 22, 22a within semiconductive material 16, but not those remaining volumes 32, 32a of second isolation trenches 24, 24a within semiconductive material 16. In one preferred embodiment, the depositing of first insulative material 34 is to no greater than 20% of the depth of the remaining volume of one of the second isolation trenches at the start of the depositing of first insulative material 34, with such "depth" referred to as being that of the trench 24 within semiconductive material 16. Further in one preferred embodiment, the depositing of first insulative material 34 is from 10% to 20% of such depth of the trenches 24 within semiconductive material 16. Further in one preferred embodiment, the depositing of first insulative material 34 is from 200 Angstroms to 600 Angstroms thick.

By way of example only, one preferred technique for depositing first insulative material 34 is by atomic layer deposition/depositing (ALD). By way of example only, an exemplary first insulative material is silicon dioxide, which can be deposited by ALD using hexachlorodisilane or dichlorosilane and $O_3$ or $O_2$ plasma as deposition precursors. ALD typically involves formation of successive atomic layers on a substrate. Described in summary, ALD includes exposing an initial substrate to a first chemical species to accomplish chemisorption of the species onto the substrate. Theoretically, the chemisorption forms a monolayer that is uniformly one atom or molecule thick on the entire exposed initial substrate. In other words, a saturated monolayer is preferably formed. Practically, chemisorption might not occur on all portions or completely over the desired substrate surfaces. Nevertheless, such an imperfect monolayer is still considered a monolayer in the context of this document. In many applications, merely a substantially saturated monolayer may be suitable. A substantially saturated monolayer is one that will still yield a deposited layer exhibiting the quality and/or properties desired for such layer.

The first species is purged from over the substrate and a second chemical species is provided to chemisorb onto the first monolayer of the first species. The second species is then purged and the steps are repeated with exposure of the second species monolayer to the first species. In some cases, the two monolayers may be of the same species. Also, a third species or more may be successively chemisorbed and purged just as described for the first and second species. Further, one or more of the first, second and third species can be mixed with inert gas to speed up pressure saturation within a reaction chamber.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include nitrogen, Ar, He, Ne, Kr, Xe, etc. Purging may instead include contacting the substrate and/or monolayer with any substance that allows chemisorption byproducts to desorb and reduces the concentration of a species preparatory to introducing another species. A suitable amount of purging can be determined experimentally as known to those skilled in the art. Purging time may be successively reduced to a purge time that yields an increase in film growth rate. The increase in film growth rate might be an indication of a change to a non-ALD process regime and may be used to establish a purge time limit.

ALD is often described as a self-limiting process in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render ALD not self-limiting. Accordingly, ALD may also encompass a species forming other than one monolayer at a time by stacking of a species, forming a layer more than one atom or molecule thick. Further, local chemical reactions can occur during ALD (for instance, an incoming reactant molecule can displace a molecule from an existing surface rather than forming a monolayer over the surface). To the extent that such chemical reactions occur, they are generally confined within the uppermost monolayer of a surface.

Traditional ALD can occur within frequently-used ranges of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting overall ALD layer. Accordingly, operating outside the traditional temperature and pressure ranges may risk formation of defective monolayers.

Further by way of example only, and wherein first insulative material 34 comprises silicon dioxide, an exemplary depositing thereof comprises: i) depositing a layer comprising a metal over outer surfaces within first isolation trenches 22, 22a and second isolation trenches 24, 24a, followed by ii) flowing a silanol to the metal of the outer surfaces effective to deposit a silicon dioxide-comprising layer within first isolation trenches 22, 22a and second isolation trenches 24, 24a. Preferred techniques for doing so are as described in our co-pending U.S. patent application Ser. No. 10/806, 923, filed on Mar. 22, 2004, entitled "Methods of Depositing Silicon Dioxide-Comprising Layers in the Fabrication of Integrated Circuitry, Methods of Forming Trench Isolation, and Methods of Forming Arrays of Memory Cells", naming Weimin Michael Li and Gurtej S. Sandhu as inventors, the complete application of which is herein incorporated by reference.

Preferred outer surfaces within first isolation trenches 22, 22a and second isolation trenches 24, 24a within semiconductive material 16 comprise at least one of silicon and silicon dioxide. The layer comprising a metal is deposited thereover, and might be comprised in elemental or alloy form, but more likely will be in a metal compound form. Regardless, exemplary preferred metals include any of aluminum, yttrium, zirconium, hafnium, and mixtures thereof, with aluminum being one preferred example. A specific preferred example is an aluminum metal compound comprising methyl aluminum and aluminum oxide, for example a chemisorbed Al—O—$CH_3$ species. Such can be formed by chemical vapor deposition, atomic layer deposition or any other deposition, whether existing or yet-to-be developed. An exemplary technique to produce the described chemisorbed species includes atomic layer deposition whereby the outer surface is initially hydroxylated to form pending/chemisorbed OH groups. Trimethylaluminum or aluminum dimethylamide, for example, can then be provided to produce an Al—O—$CH_3$ layer, for example as described in Hausmann et al., *Rapid Vapor Deposition of Highly Conformal Silicon Nanolaminates*, Science Magazine, Vol. 298, pp. 402-406 (2002). Such might produce the described layer, and might also produce alternately, or in combination therewith, a dimethylaluminide molecule with the aluminum atoms bonded to a single oxygen atom pending from the substrate. Other aluminum containing materials are, of course, contemplated. Regardless, in one preferred implementation, the aluminum layer which is formed would preferably be no more than four monolayers thick, and perhaps most preferably only be about a single monolayer (preferably saturated) thick. Regardless, any other possibility employing aluminum or other metal is also, of course, contemplated.

In such implementation, a silanol is flowed to the metal-comprising layer. Exemplary preferred silanols include alkoxy silanols, which by definition include any alkoxy silane alcohol, for example alkoxy silane diols and alkoxy silane triols. In one preferred implementation, the depositing of first insulative material 34 using such method is self-limiting to silicon dioxide-comprising deposition after completing such depositing of the layer comprising the metal. Preferred and other exemplary attributes are preferably as described in our co-pending U.S. patent application Ser. No. 10/806,923 described above.

Further by way of example only, another preferred technique where the first insulative material comprises silicon dioxide includes flowing TEOS to the substrate.

Figure 5:
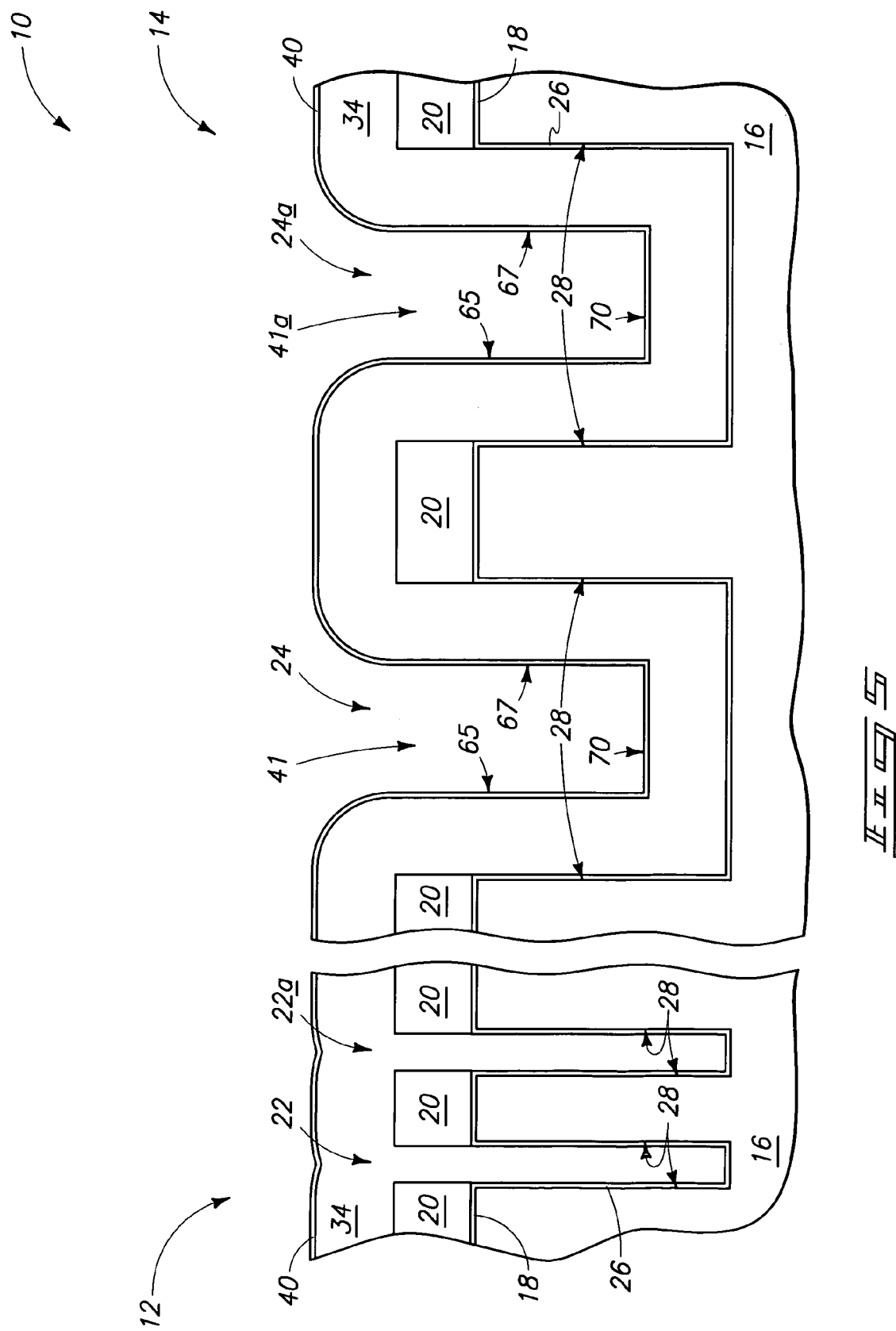
FIG. 5 is a view of the FIG. 4 substrate at a processing subsequent to that shown by FIG. 4.

Referring to FIG. 5, an intermediate insulative material lining 40 is deposited over first insulative material 34, and preferably "on" (meaning in at least some direct physical contact therewith) first insulative material 34 as shown within second isolation trenches 24, 24b within semiconductive material 16. In one preferred implementation, intermediate insulative material lining 40 is not deposited to within first isolation trenches 22, 22a. Exemplary preferred compositions for, intermediate insulative material lining 40 include insulative nitrides (i.e., $Si_3N_4$ and AlN) and $Al_2O_3$. An exemplary preferred deposition thickness for intermediate insulative material lining 40 is from about 50 Angstroms to about 150 Angstroms. In one implementation in a method of fabricating integrated circuitry, such includes depositing an insulative nitride-comprising layer (i.e., material 40) to within isolation trenches 24, 24a within semiconductive material 16 of second circuitry area 14, but not to within isolation trenches 22, 22a within semiconductive material 16 of first circuitry area 12. Regardless, second isolation trenches 24, 24a can be considered as respectively comprising some remaining volume 41, 41a within semiconductive material 16 of substrate 10. Further in the depicted preferred embodiment, intermediate insulative material lining 40 is depicted as comprising opposing sidewalls 65 and 67 that face one another within semiconductive material 16, and a base surface 70 extending from and between the opposing and facing sidewalls 65 and 67 within semiconductive material 16.

Figure 6:
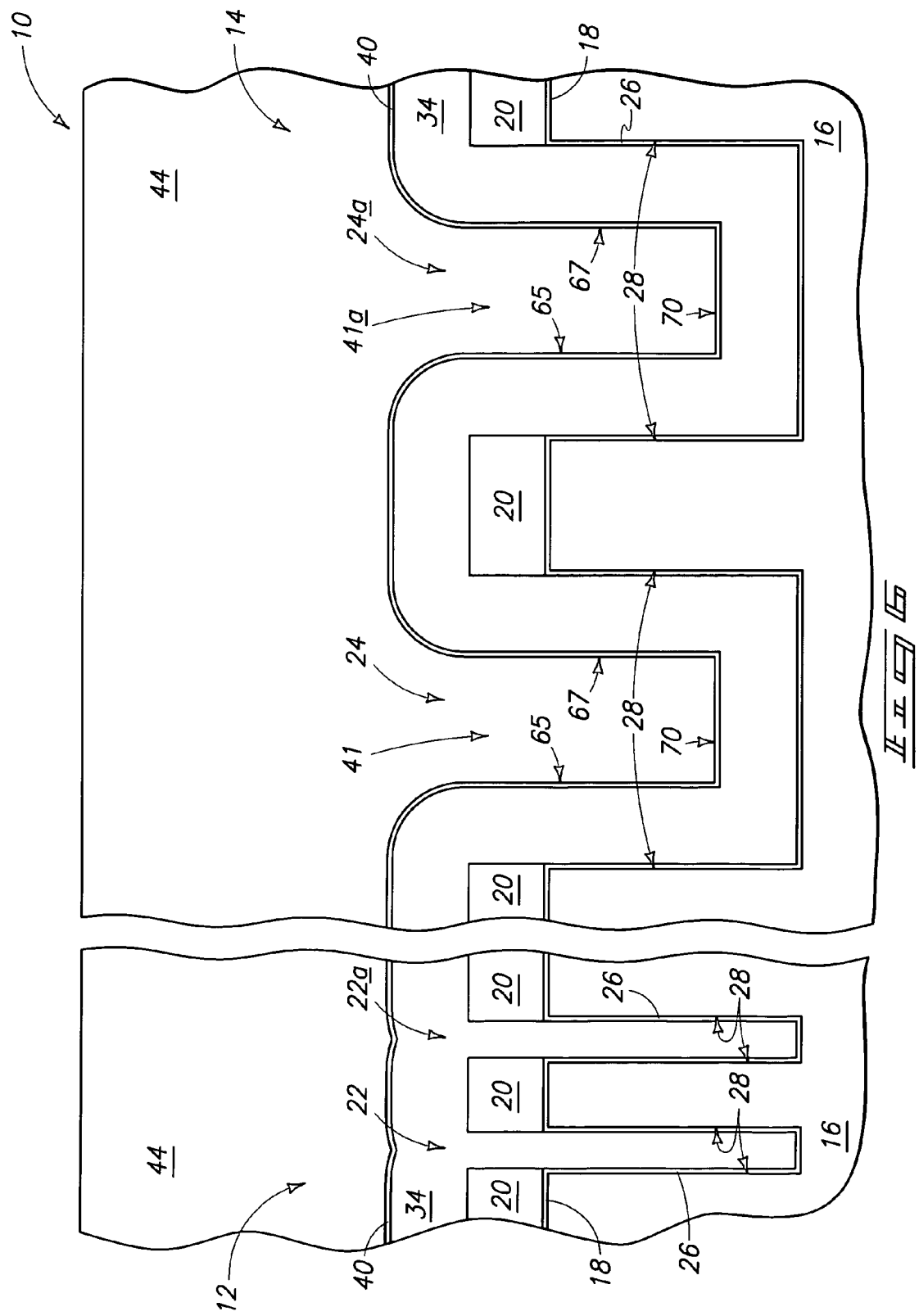
FIG. 6 is a view of the FIG. 5 substrate at a processing subsequent to that shown by FIG. 5.

Referring to FIG. 6, a second insulative material 44 has been deposited over (and preferably "on" as shown) opposing and facing sidewalls 65 and 67, and over base surface 70, effective to fill respective remaining volumes 41, 41a of second isolation trenches 24, 24a. The intermediate insulative material lining 40 is different in composition from that of first insulative material 34 and second insulative material 44. First insulative material 34 and second insulative material 44 might be the same or different in composition and/or method of deposition. Regardless, where the second insulative material comprises silicon dioxide, in one preferred implementation, the depositing of second insulative material 44 comprises at least one of (c) and (d), where (c) comprises depositing spin-on-glass, and where (d) comprises flowing $O_3$ and TEOS to the semiconductor substrate. By way of example only, a preferred technique involving ozone and TEOS includes a substrate temperature of 700° C. and a chamber pressure of 30 Torr. Further by way of example only, an exemplary furnace deposition technique using TEOS without ozone includes a temperature of from 575° C. to 700° C., a pressure range of from 500 mTorr to 800 mTorr. Second insulative material 44 might also comprise spin on glass.

As referred to in the "Background" section above, it might be desirable to density material 44 with a steam anneal, particularly where such comprises spin-on-glass and/or silicon dioxide deposited utilizing $O_3$ and TEOS. In such event, the intermediate insulative material lining 40 will preferably comprise an oxidation barrier material (i.e., any of the insulative nitrides and aluminum oxide referred to above). By way of example only, an exemplary densification process includes exposure at 700° C. in an $O_2$ ambient for 30 seconds, followed by an increase to 800° C. over 5 seconds, and then a further ramp to 1000° C. in steam for 40 minutes, followed by a 30 minute dry.

Figure 7:
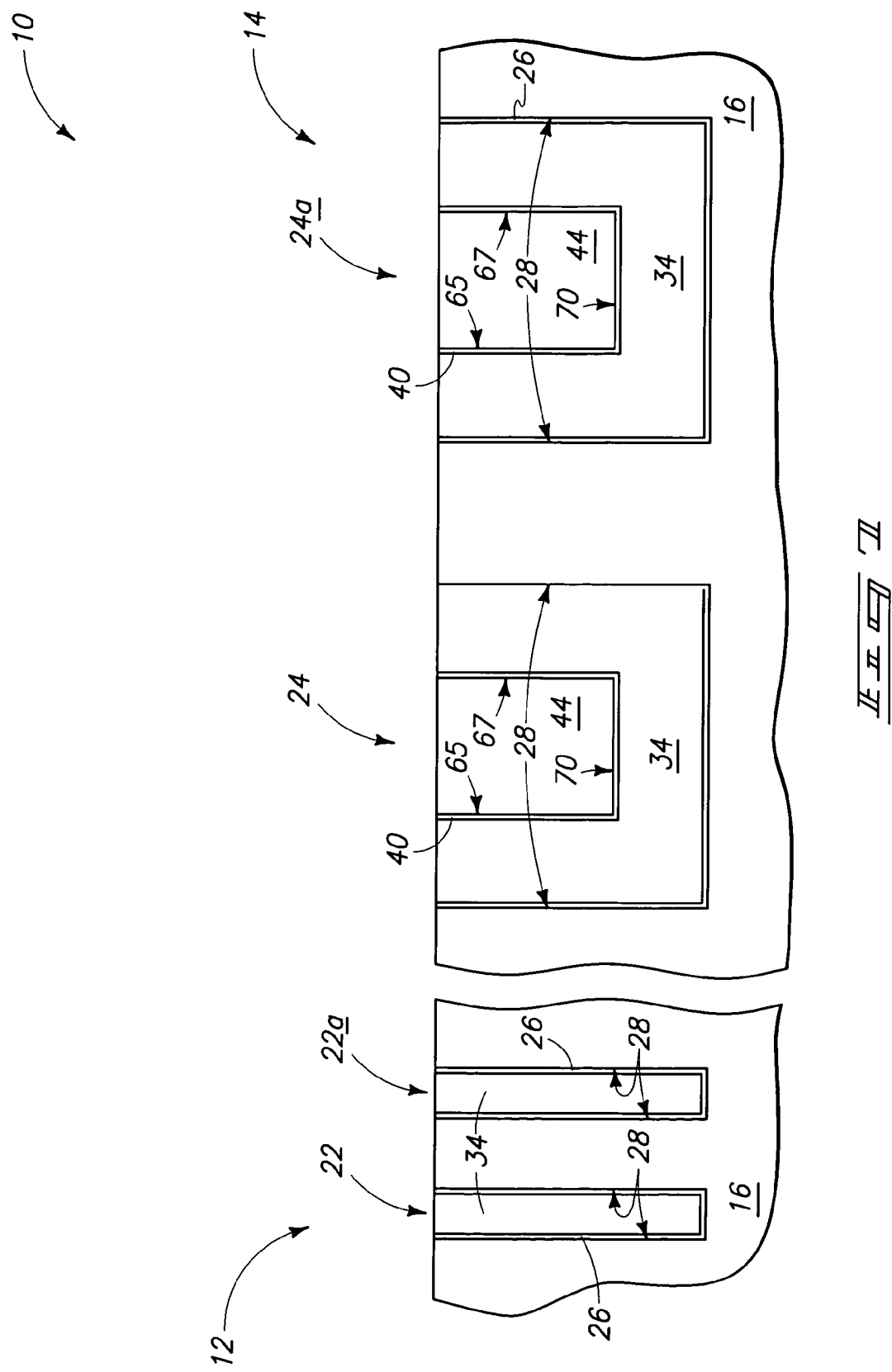
FIG. 7 is a view of the FIG. 6 substrate at a processing subsequent to that shown by FIG. 6.

Referring to FIG. 7, in one exemplary preferred embodiment, substrate 10 has been planarized back effective to remove materials 18, 20, 34, 40 and 44 from outwardly of semiconductive material 16, thereby forming the illustrated trench isolation.

In one exemplary aspect of the invention, a method of forming trench isolation in the fabrication of integrated circuitry is disclosed independent of forming multiple isolation trenches having different narrowest cross sectional dimensions. The invention also contemplates a method of fabricating integrated circuitry which includes forming isolation trenches within semiconductive material of a first circuitry area of a semiconductor substrate and within semiconductive material of a second circuitry area of the semiconductor substrate, by way of example only as described above in connection with FIG. 2. A first insulative material is deposited to within the isolation trenches of the first circuitry area and to within the isolation trenches of the second circuitry area, with the first insulative material less than filling the remaining volume of the isolation trenches within the semiconductive material of the second circuitry area. By way of example only, such is depicted above in connection with FIG. 4. After depositing the first insulative material, an insulative nitride-comprising layer is deposited to within the isolation trenches within the semiconductive material of the second circuitry area, but not to within the isolation trenches within the semiconductive material of the first circuitry area. The insulative nitride-comprising layer comprises opposing sidewalls that face one another within the semiconductive material and a base surface extending from and between the opposing and facing sidewalls within the semiconductive material. In one preferred implementation, such a method comprises fabricating the integrated circuitry to comprise memory circuitry, with first circuitry area 14 to comprise a memory array area of dynamic random access memory (DRAM) cells. However of course, fabrication of other integrated circuitry and other memory circuitry is also contemplated, and whether such circuitry is existing or yet-to-be developed.

The invention also contemplates integrated circuitry independent of the method of fabrication. Such integrated circuitry comprises a semiconductor substrate comprising a first circuitry area and a second circuitry area. By way of example only, FIG. 7 depicts such a semiconductor substrate. Isolation trenches are received within semiconductive material of the semiconductor substrate within the first circuitry area and within the second circuitry area. Trenches 22, 22a and 24, 24a of FIG. 7 are exemplary such trenches, respectively.

Insulative material is received within the isolation trenches within the semiconductive material within the first circuitry area and within the second circuitry area. In one implementation, all insulative material within the first circuitry area isolation trenches is void of any insulative nitride, and where insulative material received within the isolation trenches within the second circuitry area comprises an insulative nitride-comprising layer. Such layer comprises opposing sidewalls that face one another within the semiconductive material and a base surface extending from and between the opposing and facing sidewalls within the semiconductive material. By way of example only, where material 40 within isolation trenches 24, 24a comprises an insulative nitride, FIG. 7 depicts such an exemplary construction.

In one implementation, all insulative material within the first circuitry area trenches is void of any insulative aluminum oxide, and wherein insulative material received within the isolation trenches within the second circuitry area comprises an insulative aluminum oxide-comprising layer. Further in one implementation, such layer comprises opposing sidewalls that face one another within the semiconductive material and a base surface extending from and between the opposing and facing sidewalls within the semiconductive material. By way of example only, FIG. 7 depicts such a construction wherein material 40 comprises aluminum oxide. Preferred attributes are otherwise as described above in the construction of FIG. 7, and yet independent of the method of fabrication.

In one implementation where for example the integrated circuitry comprises memory circuitry and first circuitry area 12 comprises a memory array area comprising DRAM cells, such could be for example and by way of example only, as shown in the bitline-over-capacitor construction of FIGS. 19 and 22 of our co-pending U.S. patent application Ser. No. 10/806,923 referred to above, with isolation trenches 22, 22a filled with insulative material of FIG. 7 of this application corresponding to trenches 133 in FIGS. 19 and 22 of our co-pending U.S. patent application Ser. No. 10/806,923 referred to above. Of course, buried bit line DRAM and other memory circuitry are also contemplated.

In one preferred embodiment, the construction also spaces any nitride liner away from the edge of the trench isolation by an amount of greater than 200 Angstroms and less than 600 Angstroms.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of fabricating memory circuitry, comprising:
   forming isolation trenches within semiconductive material of a memory array area of a semiconductor substrate and within semiconductive material of a peripheral circuitry area of the semiconductor substrate;
   depositing a first insulative material to within the isolation trenches of the memory array area and to within the isolation trenches of the peripheral circuitry area, the first insulative material less than filling remaining volume of the isolation trenches within the semiconductive material of the peripheral circuitry area; and
   after depositing the first insulative material, depositing an insulative nitride-comprising layer to within the isolation trenches within the semiconductive material of the peripheral circuitry area but not to within the isolation trenches within the semiconductive material of the memory array area, the insulative nitride-comprising layer comprising opposing sidewalls that face one another within the semiconductive material and a base surface extending from and between the opposing and facing sidewalls within the semiconductive material.

2. The method of claim 1 wherein the depositing of the first insulative material is effective to fill remaining volume of the isolation trenches within the memory array area.

3. The method of claim 1 wherein the isolation trenches within the memory array area have respective narrowest cross sectional dimensions which are less than that of the isolation trenches within the peripheral circuitry area.

4. The method of claim 3 wherein the depositing of the first insulative material is effective to fill remaining volume of the isolation trenches within the memory array area.

5. The method of claim 1 wherein the insulative nitride comprises $Si_3N_4$.

6. The method of claim 1 wherein the insulative nitride comprises AlN.

7. The method of claim 1 wherein the depositing of the first insulative material comprises atomic layer depositing.

8. The method of claim 1 wherein the first insulative material comprises silicon dioxide, the depositing of the first insulative material comprises:
  i) depositing a layer comprising a metal over outer surfaces within the isolation trenches of the memory array area and of the peripheral area; and
  ii) flowing a silanol to the metal of the outer surfaces effective to deposit a silicon dioxide-comprising layer within the isolation trenches of the memory array area and of the peripheral area.

9. The method of claim 8 wherein the metal comprises a metal compound.

10. The method of claim 8 wherein the metal comprises one of aluminum, yttrium, zirconium, hafnium and mixtures thereof.

11. The method of claim 10 wherein the metal comprises aluminum.

12. The method of claim 8 wherein the metal-comprising layer is no more than 4 monolayers thick.

13. The method of claim 8 wherein the depositing of the first insulative material is self limiting to silicon dioxide-comprising deposition after completing said depositing the layer comprising the metal.

14. The method of claim 1 comprising after the depositing of the insulative nitride-comprising layer, depositing a second insulative material effective to fill remaining volume of the second isolation trench.

15. The method of claim 14 wherein the first and second insulative materials are the same.

16. The method of claim 14 wherein the first and second insulative materials are different.

17. The method of claim 14 wherein the second insulative material comprises silicon dioxide, the depositing of the second insulative material comprises at least one of (c) and (d),
  where (c) comprises depositing spin on glass; and
  where (d) comprises flowing $O_3$ and TEOS to the semiconductor substrate.

18. The method of claim 17 wherein the depositing of the second insulative material comprises (c).

19. The method of claim 17 wherein the depositing of the second insulative material comprises (d).

20. The method of claim 1 comprising fabricating the memory array area to comprise DRAM cells.

* * * * *